United States Patent [19]

Shikagawa et al.

[11] Patent Number: 5,401,155
[45] Date of Patent: Mar. 28, 1995

[54] METAL MOLD FOR FORMING A TRANSPARENT-RESIN-SEALED SEMICONDUCTOR ELEMENT

[75] Inventors: Motokiyo Shikagawa; Shigeo Kawatsu, both of Kanagawa, Japan

[73] Assignee: Fuji Electric Co., Ltd., Kanagawa, Japan

[21] Appl. No.: 41,241

[22] Filed: Apr. 1, 1993

[30] Foreign Application Priority Data

Apr. 2, 1992 [JP] Japan ................. 4-080098

[51] Int. Cl.⁶ .............................. B29C 45/40
[52] U.S. Cl. ................. 425/127; 249/160; 264/272.17; 425/129.1; 425/556
[58] Field of Search .......... 425/116, 117, 127, 544, 425/588, 808, 125, DIG. 228, 556, 129.1; 249/160, 161, 95, 91; 264/272.17; 357/72

[56] References Cited

U.S. PATENT DOCUMENTS 5,025,305 6/1991 Tomisawa et al. ............. 357/72

Primary Examiner—Tim Heitbrink
Attorney, Agent, or Firm—Finnegan, Henderson Farabow, Garrett & Dunner

[57] ABSTRACT

Disclosure is a metal mold for forming a transparent-resin-sealed semiconductor element which, when the molding is removed from it with knock-out pins, will not rub the molding mirror surface of the light transmitting window of the resin package, thus permitting the removal of the molding with the molding mirror surface maintained as it is. In the metal mold for a transparent-resin-sealed semiconductor element which is formed by sealing a semiconductor photo-electric element mounted on a lead frame in a rectangular-parallelepiped-shaped transparent resin package having a light transmitting window on its front end, the cavity surface of the upper die (a cavity block) which corresponds to the light transmitting window has a draft angle $\theta$ and the surfaces of cavity blocks between which the lead frame is held are perpendicular to the cavity surface, so that, when the molding is released from the metal mold with a knock-out pin, the surface of the light transmitting window is prevented from being rubbed by the metal mold.

2 Claims, 2 Drawing Sheets

METAL MOLD FOR FORMING A TRANSPARENT-RESIN-SEALED SEMICONDUCTOR ELEMENT

BACKGROUND OF THE INVENTION

1. Field of the invention

This invention relates to a metal mold for forming a resin package of a transparent-resin-sealed semiconductor element such as a laser diode and a method for forming the resin package thereof.

2. Description of the Prior Art

FIG. 3 shows the aforementioned laser diode. In FIG. 3, reference numeral 1 designates a semiconductor laser element; 2, a lead frame on which the semiconductor laser element 1 is mounted; and 3, a transparent resin package. The resin package 3 is in the form of a rectangular parallelepiped. The resin package 3 has a light transmitting window 3a in the front end face, which is perpendicular to the optical axis of a laser beam 4 emitted forwardly from the semiconductor laser element 1. It is essential that the light transmitting window is accurately perpendicular to the optical axis of the laser beam, and has a flat molding mirror surface; otherwise, the laser beam from the semiconductor laser element 1 is refracted, so that the emergent light path is bent or the beam is scattered.

FIG. 4 shows the conventional structure of a transfer molding metal mold for forming the resin package. In FIG. 4, reference numeral 5 designates a stationary upper die; 6, a movable lower die; 7, a runner; 8, a gate; and 9 and 10, knock-out pins. Each of the upper and lower dies 5 and 6 is a sectional die; that is, the upper die 5 comprises cavity blocks 5a, 5b and 5c, and the lower die 6 comprises cavity blocks 6a, 6b and 6c. Those cavity blocks are combined to form a cavity.

The resin package 3 is formed with the metal mold as follows: The assembly of the semiconductor laser element 1 and the lead frame 2 is inserted into the metal mold with the lead frame 2 held between the upper die 5 and the lower die 6. Under this condition, transparent casting resin is injected into the metal mold through the runner 7 and the gate 8. Thus the semiconductor laser element with the lead frame has been molded with the resin. Next, while the metal mold being opened, the knock-out pin 9 is operated to release the molding from the upper die 5. Under this condition, the molding still remains in the lower die. Therefore, the knock-out pin 10 is operated to take the molding out of the lower die 6.

The conventional metal mold constructed as described above is disadvantageous in the following points: That is, in the mold shown in FIG. 4, the cavity surface of the cavity block 5a, which surface corresponds to the light transmitting window 3a of the resin package 3, is in parallel with the direction in which the molding is knocked out. Hence, while the molding is being removed from the upper die 5 with the knock-out pin 9, the surface of the light transmitting window 3a of the resin package 3 is rubbed by the cavity surface 5d of the cavity block 5a of the upper die 5, so that the surface of the light transmitting window 3a, which was a molding mirror surface when formed, is scratched, that is, fine scratches are formed in the surface.

The scratched surface is processed as follows: That is, heretofore after the molding is taken out of the metal mold, the scratched surface of the light transmitting window 3a is manually finished into a molding mirror surface by lapping. The lapping operation takes much time and labor, increasing the number of manufacturing steps, and accordingly the manufacturing cost of the semiconductor laser device.

SUMMARY OF THE INVENTION

Accordingly, an object of this invention is to eliminate the above-described difficulties accompanying a conventional metal mold for forming a transparent-resin-sealed semiconductor element. More specifically, an object of the invention is to provide a metal mold for forming a transparent-resin-sealed semiconductor element which, when the molding is removed from it with knock-out pins, will not rub the molding mirror surface of the light transmitting window of the resin package, thus permitting the removal of the molding with the molding mirror surface maintained as it is.

The foregoing object of the invention has been achieved by the provision of a metal mold, in which, according to the invention, the cavity surface of the metal mold which corresponds to said light transmitting window has a draft.

Furthermore, in the metal mold, the surface of the upper die and the surface of the lower die between which the lead frame is held are perpendicular to the cavity surface which corresponds to the light transmitting window of the transparent package.

According to an aspect of the present invention, there is provided that a method for forming a resin package of a transparent-resin-sealed semiconductor element comprising the steps of:

inserting an assembly of a semiconductor laser element and a lead frame into a metal mold including:
an upper and lower dies, said upper die having cavity blocks and said lower die having cavity blocks, said cavity blocks being combined to form a cavity;
injecting transparent casing resin into said cavity of said metal mold through a runner and a gate;
opening said metal molding;
operating knockout pins to release said resin package from said upper and lower dies,
wherein said resin package having a light transmitting window is formed in such a manner that said window is perpendicular to an optical axis and a cavity surface of one on said metal mold dies which corresponds to said light transmitting window has a draft.

In the metal mold of the invention, the cavity surface has the draft. Therefore, when the molding is released from the metal mold with the knock-out pins, the cavity surface will never rub the light transmitting window of the resin package. Thus, the molding can be removed from the metal with the molding mirror surface of the light transmitting window maintained as it is.

DETAILED DESCRIPTION OF THE PREFERRED EMBODIMENTS

Figure 4:
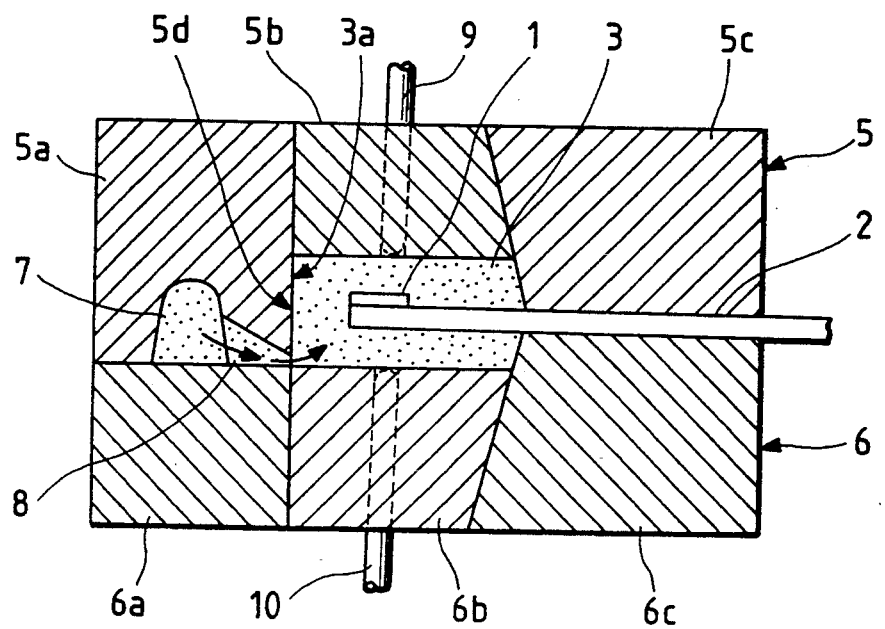
FIG. 4 is sectional view showing a conventional metal mold for forming a transparent-resin-sealed semiconductor element.

One preferred embodiment of this invention will be described with reference to FIGS. 1 and 2, in which parts corresponding functionally to those which have been described with reference to FIG. 4 are therefore designated by the same reference numerals or characters.

Figure 1:
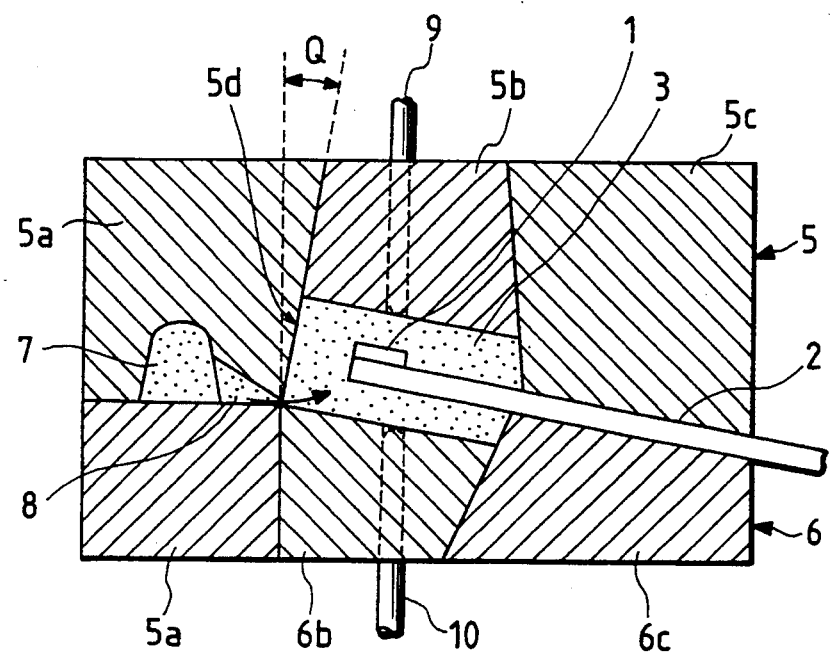
FIG. 1 is a sectional view showing the structure of a metal mold for forming a transparent-resin-sealed semiconductor element according to this invention.
Figure 2:
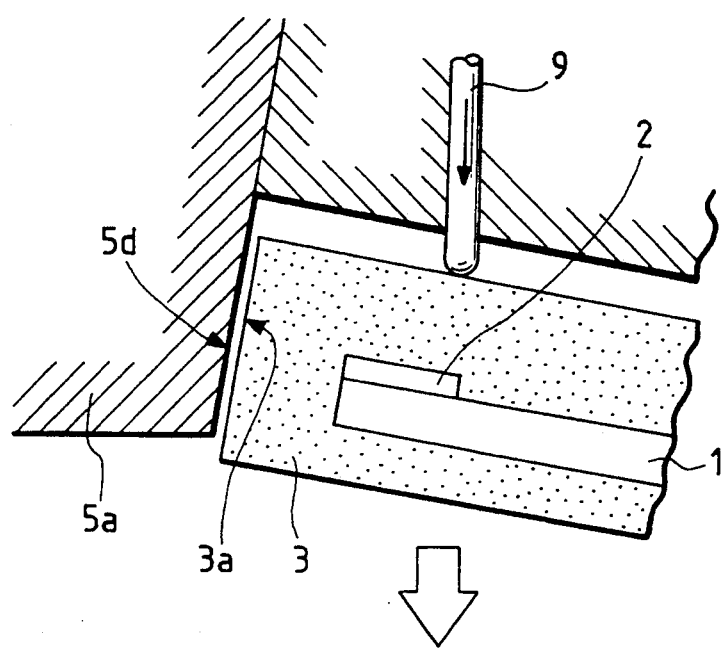
FIG. 2 is a fragmental view for a description of a process of releasing a molding from the metal mold shown in FIG. 1.
Figure 3:
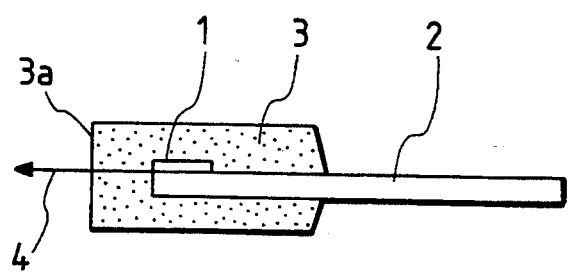
FIG. 3 is an explanatory diagram showing a resin-sealed laser diode which is formed with the metal mold according to the invention.

A metal mold according to the invention is as shown in FIG. 1. The metal mold is fundamentally equal in structure to the conventional metal mold shown in FIG. 4. A cavity surface of the upper die 5, namely, the cavity surface 5d of the cavity block 5a has a draft angle $\theta$, and the surface of the cavity block 5c of the upper die 5 and the surface of the cavity block 6c of the lower die 6, between which the lead frame 2 is to be held, are made perpendicular to the cavity surface 5d, and the cavity surfaces of the cavity blocks 5c and 6c which are located opposite to the cavity block 5a also have suitable draft angles so that no undercuts are formed in the molding. The knock-out pins 9 and 10, similarly as in the conventional metal mold, are operated from above and from below, in a direction in which the metal mold is opened; that is, they are operated from above and below forming an angle of $\theta$ with the cavity surface 5d having the draft.

After the molding has been formed, the knock-out pin 9 is operated to push the molding out of the upper die 5 as shown in FIG. 1. That is, when the molding is released from the metal mold, the surface of the light transmitting window 3a will not be rubbed by the cavity surface 5d of the cavity block 5a.

The metal mold constructed as described above has the following effects:

(1) The cavity surface of the metal mold which corresponds to the surface of the light transmitting window of the resin package has the draft. Hence, in removing the molding from the metal mold with the knock-out pins, the surface of the light transmitting window will never be rubbed by the metal mold; that is, the surface is positively prevented from being scratched by the metal mold. Thus, the product is greatly improved in quality and in yield. In addition, employment of the metal mold of the invention eliminates the difficulty accompanying the conventional metal mold that the surface of the light transmitting window must be finished by lapping.

(2) The surface of the light transmitting window of the resin package formed with the metal mold is perpendicular to the lead frame. Hence, the light beam emitted from a semiconductor photo-electric element such as a laser diode mounted on the lead frame will not be undesirably refracted. Thus, a transparent-resin-sealed semiconductor element high in reliability can be manufactured according to the invention.

What is claimed is:

1. A metal mold for a transparent-resin-sealed semiconductor element comprising:

a plurality of metal mold dies for forming a transparent resin sealed semiconductor element by sealing a semiconductor element mounted on a lead frame in a rectangular-parallelepiped-shaped transparent resin package having a light transmitting window formed on a side thereof in such a manner that said window is perpendicular to an optical axis, the resin package being initially released from the mold dies in a direction of release;

one of said metal mold dies having a cavity surface to form said light transmitting window, said cavity surface being inclined to diverge from said direction of release.

2. A metal mold as claimed in claim 1, wherein said metal mold dies include upper and lower dies, a surface of said upper die and a surface of said lower die between which said lead frame is held being perpendicular to said cavity surface of said metal mold to form said light transmitting window of said transparent package.

* * * * *